(12) United States Patent
Masaki et al.

(10) Patent No.: US 6,574,249 B2
(45) Date of Patent: Jun. 3, 2003

(54) THIN FILM LASER EMITTING DEVICE AND METHOD FOR THE MANUFACTURE THEREOF

(75) Inventors: Yuichi Masaki, Tokyo (JP); Kazuho Murata, Tokyo (JP); Akinobu Maekawa, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/799,974

(22) Filed: Mar. 5, 2001

(65) Prior Publication Data

US 2001/0021204 A1 Sep. 13, 2001

(30) Foreign Application Priority Data

Mar. 9, 2000 (JP) .................................. 2000-064744

(51) Int. Cl.[7] .............................. H01S 3/30; H01S 5/00; H01S 3/097; H01S 3/08
(52) U.S. Cl. ............................. 372/7; 372/50; 372/87; 372/102
(58) Field of Search ............................................ 372/7

(56) References Cited

U.S. PATENT DOCUMENTS

2002/0009274 A1 * 1/2002 Gharavi ...................... 385/122

* cited by examiner

Primary Examiner—Quyen Leung
Assistant Examiner—Armando Rodriguez
(74) Attorney, Agent, or Firm—Katten Muchin Zavis Rosenman

(57) ABSTRACT

A thin film laser emitting device includes a Bragg reflector including a recess and one or more diffraction gratings provided around the recess, a thin film laser layer formed in the recess, for generating lights, the lights being reflected by the diffraction gratings, a pair of electrodes, provided in the recess to have the thin film laser layer therebetween, and a laser emitting means, provided at a portion of the gratings, for emanating the reflected lights.

20 Claims, 7 Drawing Sheets

THIN FILM LASER EMITTING DEVICE AND METHOD FOR THE MANUFACTURE THEREOF

FIELD OF THE INVENTION

The present invention relates to a thin film laser emitting device and a method for the manufacture thereof; and, more particularly, to a thin film laser emitting device and a method for the manufacture thereof, the laser emitting device incorporating therein a thin film laser layer, a Bragg reflector for resonating and reflecting the light from the laser generation layer to generate laser and a laser emitting member for radiating the laser.

BACKGROUND OF THE INVENTION

Semiconductor laser devices may be classified into edge emitting laser devices and surface emitting laser devices. An edge emitting device is provided with two cleaved facets serving as end faces of an optical resonator. The facets are normally formed by etching and function as reflectors of the laser generated inside the laser cavity. Generally, it is preferable that one of the facets has 100% reflectance and the other have a reflectance close to 100%, e.g., 99%. The laser generated inside the cavity is extracted through the facet with the lower reflectance. A surface emitting laser device may be constructed by integrating a reflecting surface close to the laser emitting facet of the side emitting laser diode to thereby guide the laser toward the top surface of the laser device. In either case, a multilayer thin film coating is required on each facet to control the reflectivity thereof.

However, the multilayer thin film coating may not be properly performed on a wafer basis in which the facets of the laser cavity are formed by a wafer process, e.g., dry etching carried out on a wafer scale. The thin film coating performed on the wafer basis may result in degradation or non-uniformity in the thickness of coating layer being formed on the facets of the laser device because incident angles of coating materials to the facets may not be controlled to be identical. As a result, there frequently occur spatial deviation and the temporal change in the reflectance of the facets. Further, it is also difficult to prevent the coating layers from being formed on other regions than the facets.

On the other hand, if the multilayer thin film coating is performed on a device basis after dicing the wafer into discrete laser devices, manufacturing efficiency is severely deteriorated and the advantage of the full wafer process can not be fully exploited. Further, in case of the surface emitting laser device described above, slant incident coating is still necessary due to the presence of the reflecting surface for guiding the laser toward the top surface.

In order to solve the foregoing problems, there is disclosed in Japanese Patent Laid-Open Publication No. 98-190123 a laser emitting device including corrugated diffraction grating formed on end faces of a resonator for controlling the reflectance thereof. The corrugated diffraction grating is formed by etching using an etching mask having a pattern corresponding to the grating.

Since, however, the corrugated grating is formed by etching on the end surfaces of the resonator in such a laser emitting device, the process therefor becomes complicated, lowering the productivity and increasing the manufacturing cost.

SUMMARY OF THE INVENTION

It is, therefore, an object of the present invention to provide a less costly and highly efficient thin film laser emitting device and a method for the manufacture thereof.

In accordance with one aspect of the present invention, there is provided a thin film laser emitting device, comprising:

a Bragg reflector including a recess and one or more diffraction gratings provided around the recess;

a thin film laser layer formed in the recess, for generating lights, the lights being reflected by the diffraction gratings;

a pair of electrodes, provided in the recess to have the thin film laser layer therebetween; and a laser emitting means, provided at a portion of the gratings, for emanating the reflected lights.

In accordance with another aspect of the present invention, there is provided a method for manufacturing a thin film laser layer emitting device, comprising the steps of:

forming a Bragg reflector including a recess and one or more diffraction gratings provided around the recess;

forming a first electrode in the recess;

forming a thin film laser layer on the first electrode; and forming a second electrode on the thin film laser layer.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
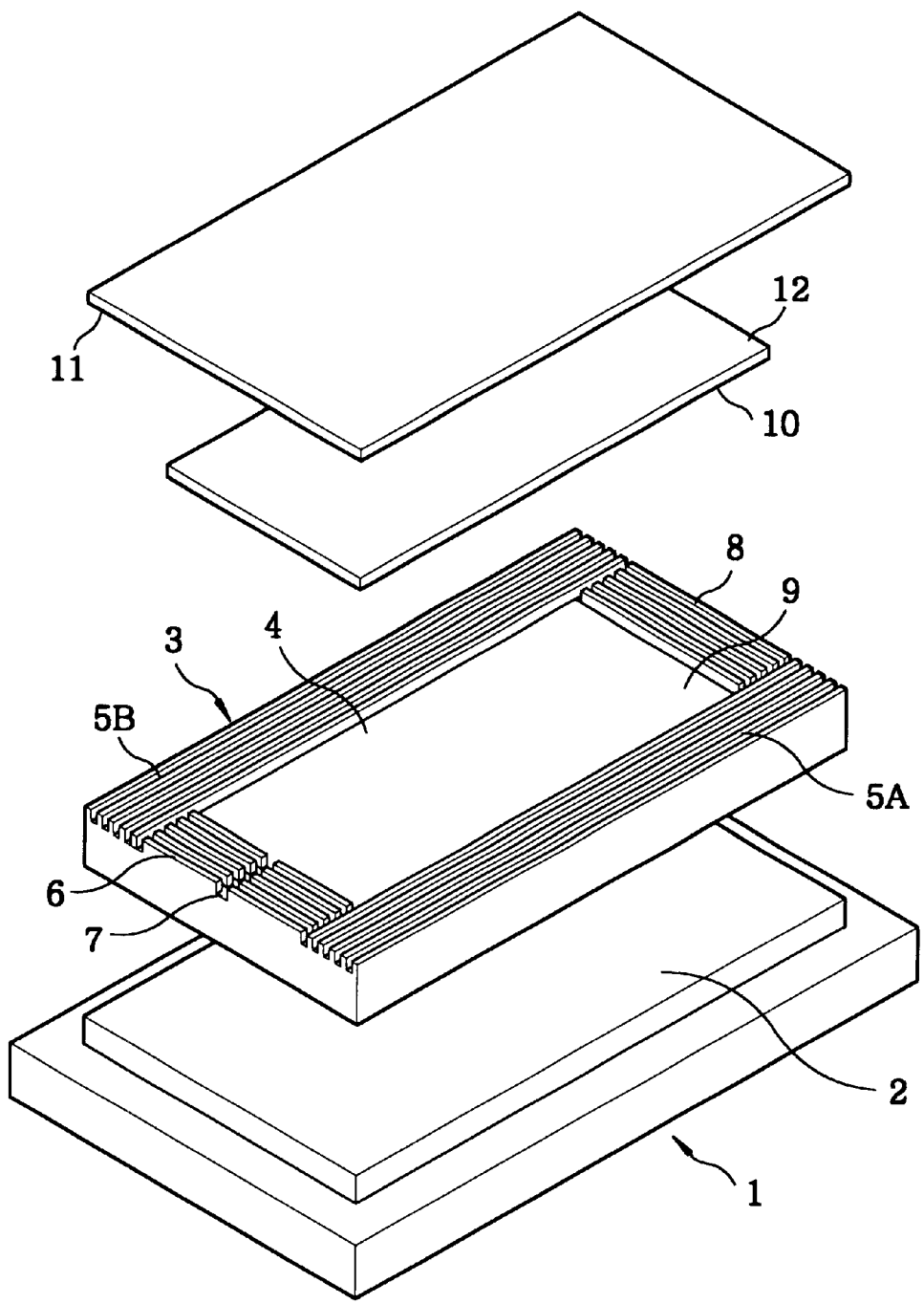
FIG. 1 shows a schematic exploded view of a thin film laser emitting device in accordance with a first preferred embodiment of the present invention.

The preferred embodiments of the present invention will now be described in detail with reference to the accompanying drawings, wherein like parts appearing FIGS. 1 to 13 are represented by like reference numerals.

Figure 2:
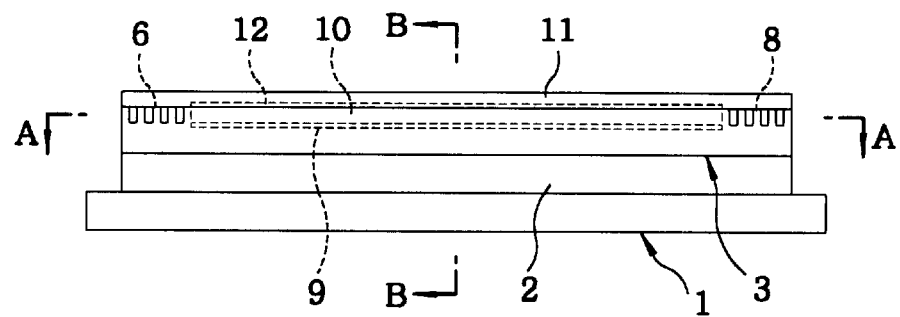
FIGS. 2 to 4 describe side, plan and front views of the thin film laser emitting device shown in FIG. 1, respectively.
Figure 3:
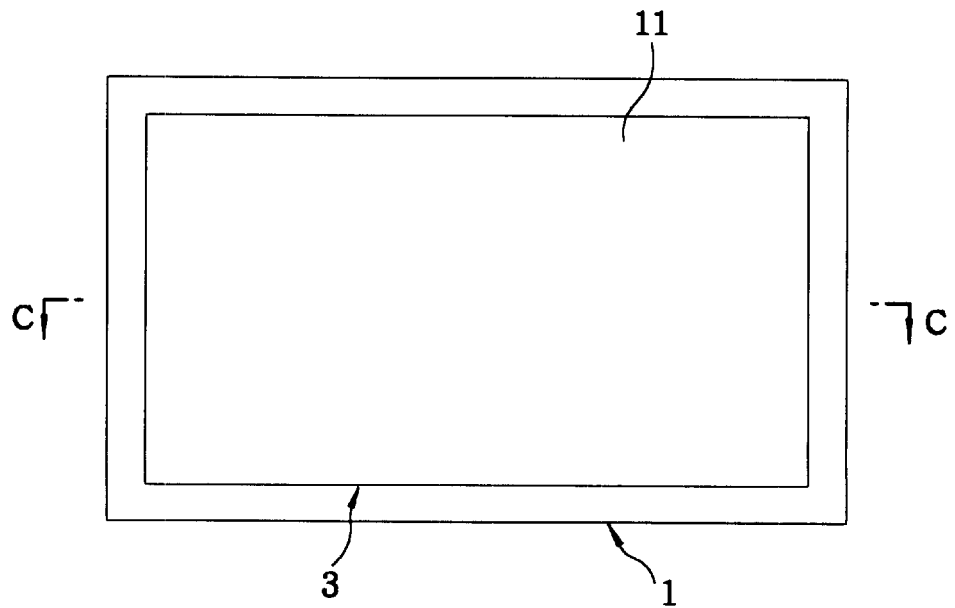
Figure 4:
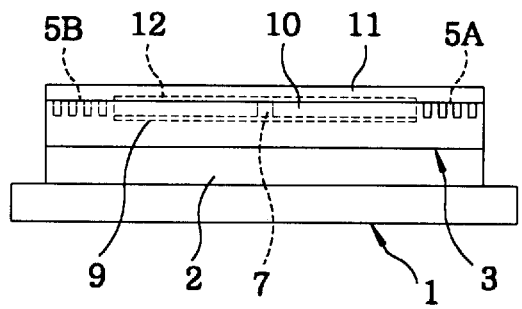
Figure 5:
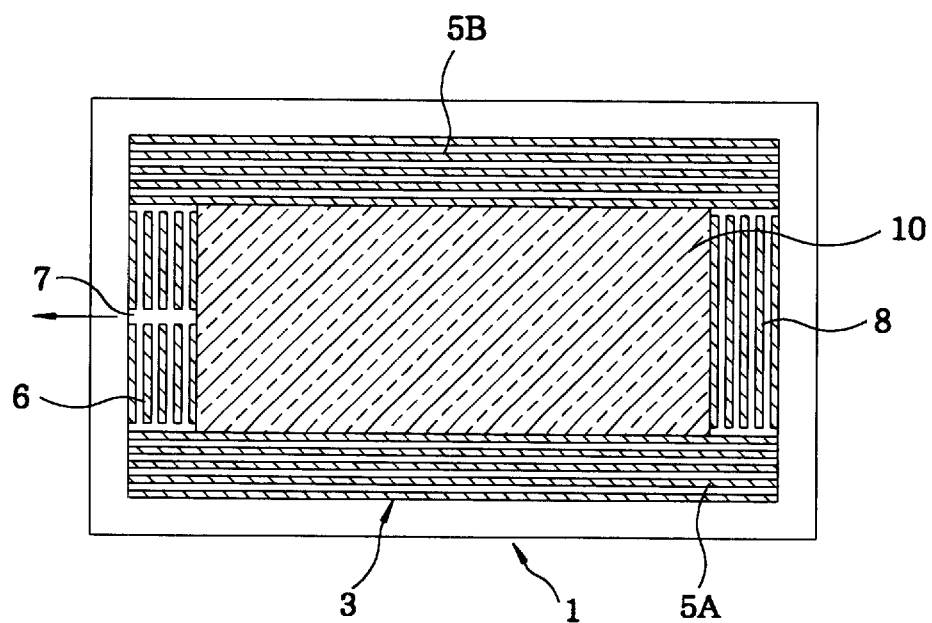
FIGS. 5 and 6 present cross sectional views taken along the lines A—A and B—B of FIG. 2, respectively.
Figure 6:
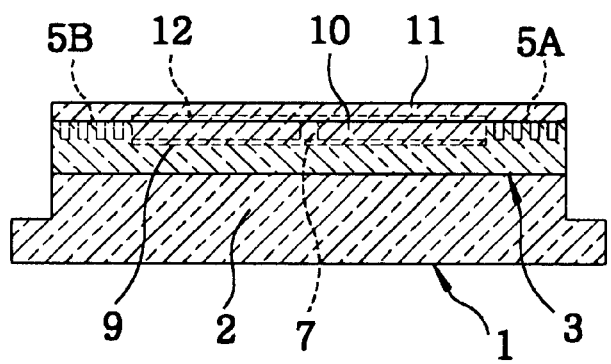
Figure 7:
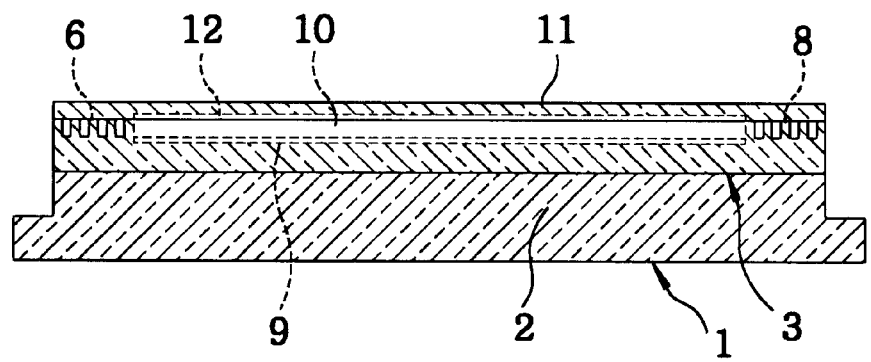
FIG. 7 is a cross sectional view taken along the line C—C in FIG. 3.

Referring to FIG. 1, there is shown a schematic exploded view of a thin film laser emitting device in accordance with a first preferred embodiment of the present invention. As shown, the inventive device includes a substrate 1, a Bragg reflector 3 and a cap 11. FIGS. 2 to 4 respectively depict a side, a plan and a front view of the thin film laser emitting device shown in FIG. 1. FIGS. 5 and 6 respectively present cross sectional views taken along the lines A—A and B—B in FIG. 2. FIG. 7 is a cross sectional view taken along the line C—C in FIG. 3.

The substrate 1 is obtained by molding a resin such as polymethylmethacrylate (PMMA) or acryl resin and has a, e.g., rectangular plate-like shape. A seat member 2 is provided at a center portion on top of the substrate 1. The seat member 2 preferably has an identical 2-dimensional size to that of the Bragg reflector 3 to be provided thereon.

The Bragg reflector 3 is also obtained by forming a resin such as PMMA or acryl resin into a, e.g., rectangular transparent plate-like shape. At a center portion of the top surface of the Bragg reflector 3, there is provided a recess 4. The bottom of the recess 4 is generally flat and has a rectangular shape. Along a peripheral region of the top surface of the Bragg reflector 3, there are formed corrugated diffraction gratings 5A, 5B, 6, 8 surrounding the recess 4. The Bragg reflector 3 may be made by, e.g., an injection molding technique using a mold obtained by, e.g., electroforming a stamper.

Among the set of four gratings 5A, 5B, 6, 8, a first pair of gratings 5A, 5B is located at two opposing longer sides of the top surface of the Bragg reflector 3. A second pair of gratings 6, 8 is prepared at two opposite shorter sides of the top surface between the first pair of gratings 5A, 5B. As is well-known in the art, a grating is formed by a plurality of regularly spaced corrugations. The recess 4 defined by the diffraction gratings 5A, 5B, 6, 8 functions as a space for accommodating therein a thin film laser layer 10 and a pair of electrodes 9, 12, as will be described later.

The diffraction gratings 5A, 5B, 6 and 8 surrounding the recess 4 are designed to totally reflect laser components propagating parallel to the bottom surface of the recess 4. For example, for the laser with a wavelength of 650 nm, the longer side of the recess 4 between the gratings 6 and 8 preferably has a length of 2080 µm. The preferable width of the respective corrugations of the diffraction gratings 5A, 5B, 6, 8 is 0.48 µm, and the preferable width of respective bottom regions between neighboring corrugations is 0.71 µm (i.e., the corrugation period is 1.19 µm). Each of the diffraction gratings 5A, 5B, 6, 8 is formed by 5 corrugations.

Further, one of the diffraction gratings, e.g., the grating 6, is provided with a slit-shaped opening 7 for emitting therethrough the laser generated from the thin film laser layer 10. Under the above conditions, the width of the opening 7 is preferably 5 µm.

The depth of the recess 4, in which a thin film laser layer 10 and a pair of electrodes 9, 12 are formed, corresponds to the height of the corrugations of the diffraction gratings 5A, 5B, 6, 8. The height of the corrugations is preferably designed to be not less than the total thickness of the thin film laser layer 10 and the electrodes 9, 12 which are to be formed in the recess 4. A preferable height of the corrugations in this embodiment is 2 µm.

The bottom surface of the Bragg reflector 3 is attached on top of the seating member 2, e.g., by gluing. The Bragg reflector 3 and the substrate 1 can be molded together as a single entity if desired. However, the Bragg reflector 3 may not necessarily be used in conjunction with the substrate 1. The thin film laser emitting device of the present invention can properly operate without having to incorporate therein the substrate 1.

As clearly shown in FIGS. 2 to 7, formed on the bottom of the recess 4 surrounded by the corrugated gratings 5A, 5B, 6, 8 is the electrode 9 provided by, e.g., vacuum-evaporating a metal such as Au, Ag, Al, Ni, or the like with a high conductivity and metallic luster. The electrode 9 is electrically connected to an external power source (not shown).

The thin film laser layer 10 is formed on the electrode 9. The thin film laser layer 10 is most preferably formed of an organic electroluminescent material. Vacuum evaporation can be used to deposit the organic electroluminescent material on the electrode 9. Even though the thin film laser layer 10 is depicted in FIG. 1 as having a rectangular plate-like shape for the sake of simplicity, but it is to be noted that the shape of the thin film layer 10 is not necessarily limited thereto.

On the thin film laser layer 10 is provided the electrode 12 by, e.g., vacuum-evaporating such a high conductive and lustrous metal as Au, Ag, Al or Ni. The electrode 12 is also electrically connected to the external power Source.

Finally, the recess 4 incorporating therein the thin film laser layer 10 and the electrodes 9, 12 is covered by the cap 11 mounted on the Bragg reflector 3. The cap 11 may not be necessarily required but can be used to protect the electrodes 9, 12 and/or the thin film laser layer 10 from contamination.

When a power is applied from the power source to the electrodes 9, 12, the thin film laser layer 10 generates lights. The generated lights are confined by the lustrous electrodes 9, 12 serving as reflecting layers and propagate along plane directions parallel to the electrodes 9 and 12. The light propagating along the plane directions are reflected by the corrugated diffraction gratings 5A, 5B, 6, 8. The lights thus generated are emanated through the opening 7 as the laser.

Figure 8:
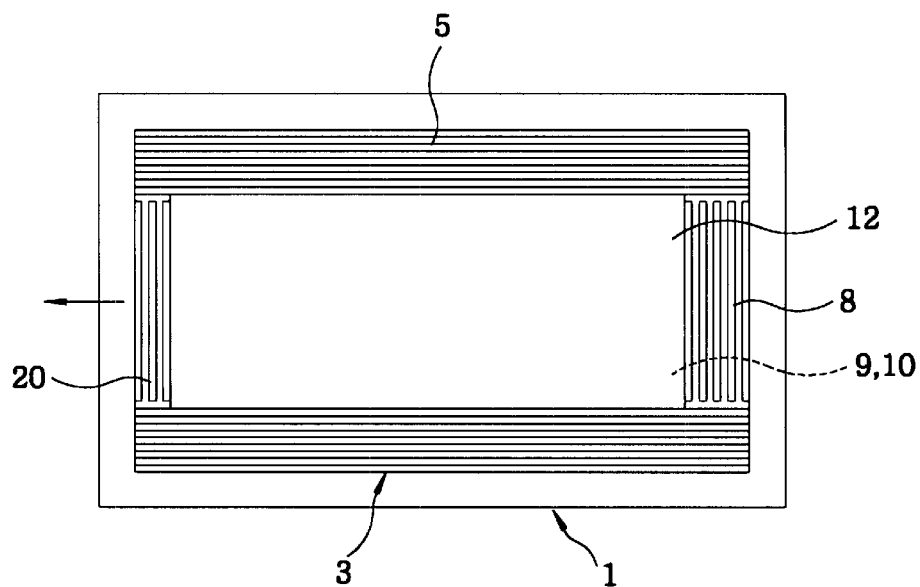
FIG. 8 depicts a plan view of a thin film laser emitting device having a grating structure in accordance with a second preferred embodiment of the present invention.

Referring to FIG. 8, there is illustrated a plan view of a thin film laser emitting device showing a grating structure of a Bragg reflector 3 in accordance with a second preferred embodiment of the invention. The device is similar to that of the first preferred embodiment excepting for a widthwise corrugated diffraction grating 20. As shown, the widthwise corrugated grating 20 has no opening for emitting laser. Instead, the number of corrugations of the widthwise corrugated grating 20 is decreased from five to three to emit the laser therethrough. In this case, the laser intensity may be lower than that of the first embodiment due to extended width of the region through which the laser emanates. The grating structure of the second embodiment can be advantageously employed in applications requiring a limited laser intensity.

Figure 9:
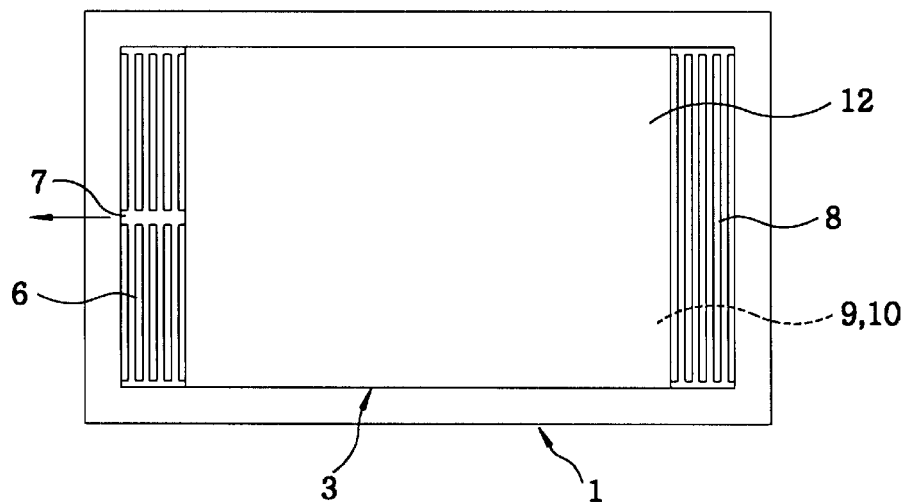
FIG. 9 represents a plan view of a thin film laser emitting device having a grating structure in accordance with a third preferred embodiment of the present invention.

Referring to FIG. 9, there is shown a plan view of a thin film laser emitting device showing a grating structure of a Bragg reflector 3 in accordance with a third preferred embodiment of the invention. The device is similar to that of the first preferred embodiment excepting that there are provided only two gratings 6 and 8 along two opposite shorter sides of the Bragg reflector 3. In this case, the lights generated from the thin film laser layer 10 are repeatedly reflected from the opposite corrugated diffraction gratings 6, 8 to generate laser and then the generated laser is emitted through the opening 7 provided at the center of the grating 6.

Figure 10:
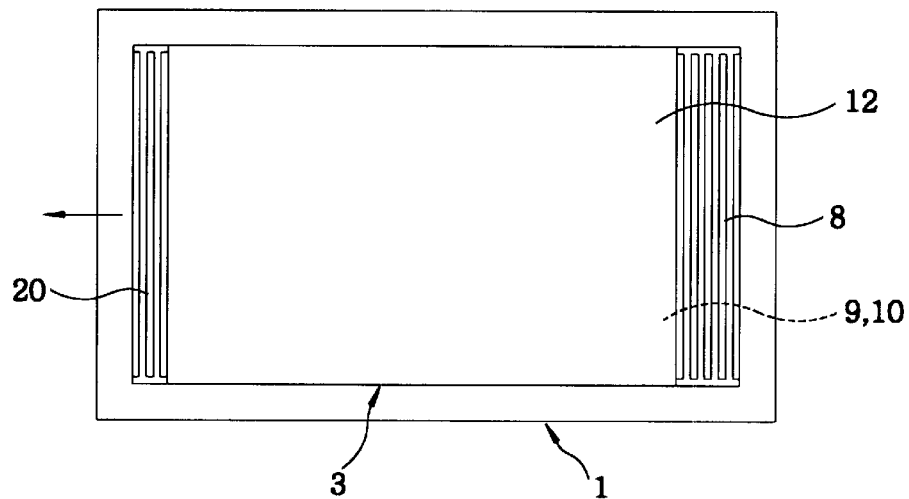
FIG. 10 illustrates a plan view of a thin film laser emitting device having a grating structure in accordance with a fourth preferred embodiment of the present invention.

Referring to FIG. 10, there is shown a plan view of a thin film laser emitting device showing a grating structure of a Bragg reflector 3 in accordance with a fourth preferred embodiment of the invention. The device is similar to that of the second preferred embodiment excepting that there are provided only two gratings 20 and 8 along two opposite shorter sides of the Bragg reflector 3. In this embodiment, no opening is provided in the gratings 20. Instead, the number of corrugations thereof is reduced from five to three, enabling a portion of lasers obtained in the optical cavity to transmit through the grating 20.

Figure 11:
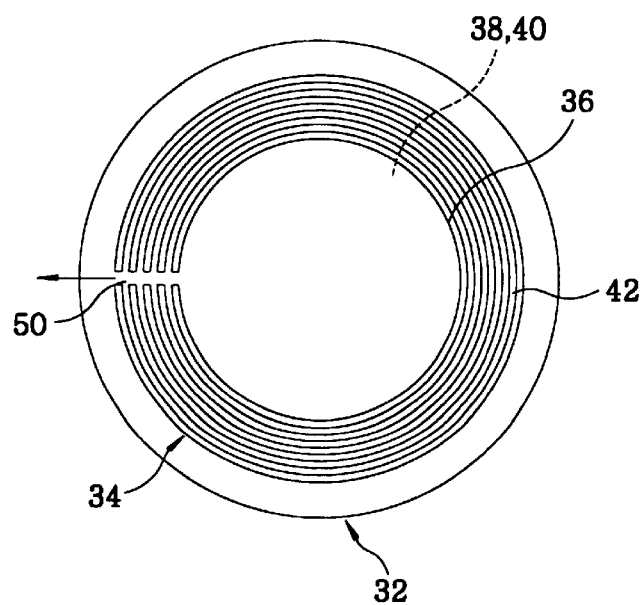
FIG. 11 sets forth shows a plan view of a thin film laser emitting device having a grating structure in accordance with a fifth preferred embodiment of the present invention.

Referring to FIG. 11, there is shown a plan view of thin film laser emitting device showing a grating structure of a Bragg reflector 34 in accordance with a fifth preferred embodiment of the invention. The device is similar to the one of the first embodiment excepting for the shapes of elements constituting the device. To be more specific, all of a substrate 32, a Bragg reflector 34, a thin film laser layer 40, a lower electrode 38, an upper electrode 36 and a corrugated diffraction grating 42 have a circular shape when viewed from the top. There exists only one grating in this embodiment. Particularly, the corrugated diffraction grating 42 is constituted by equally-spaced concentric circular corrugations and is provided with an opening 50 for emanating therethrough the laser generated from the laser layer 40 along a radial direction of the grating 42.

Figure 12:
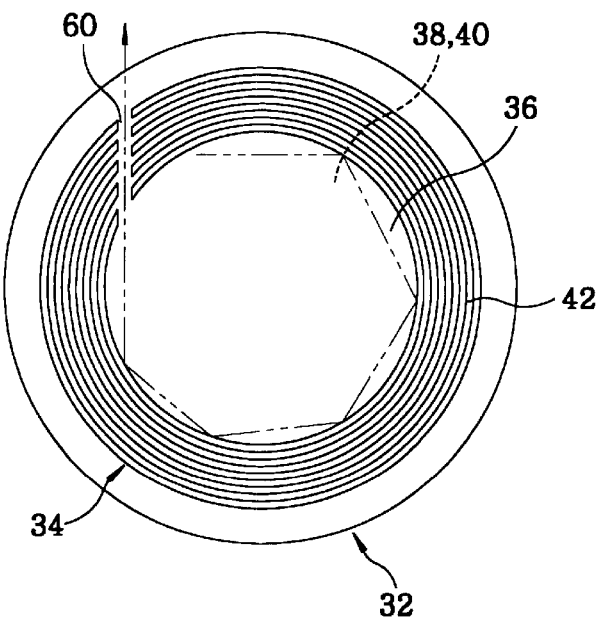
FIG. 12 discloses a plan view of a thin film laser emitting device having a grating structure in accordance with a sixth preferred embodiment of the present invention.

Referring to FIG. 12, there is shown a plan view of thin film laser emitting device showing a grating structure of a Bragg reflector 34 in accordance with a sixth preferred embodiment of the invention. The device is similar to that of the fifth embodiment excepting for a location of an opening 60. The opening 60 is designed such that the laser is emitted along a tangential direction of the diffraction grating 42. In FIG. 12, the trajectory of the laser extracted through the opening 60 is exemplarily indicated by a long dashed double-dotted line.

Figure 13:
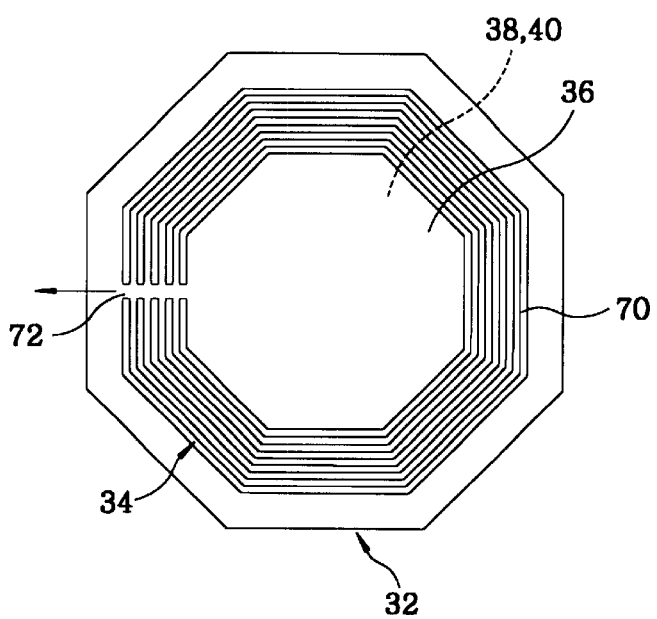
FIG. 13 offers a plan view of a thin film laser emitting device having a grating structure in accordance with a seventh preferred embodiment of the present invention.

Referring to FIG. 13, there is shown a plan view of thin film laser emitting device showing a grating structure of a Bragg reflector 34 in accordance with a seventh preferred embodiment of the invention. The device is similar to that of the fifth embodiment excepting for a polygonal grating 70 having an opening 72 for emitting the laser.

Although the fifth to the seventh preferred embodiments have been described as having the openings for emanating the laser therethrough, identical results can be obtained by forming at a part of the grating a semitransparent mirror portion capable of emitting laser therethrough, e.g., as in the second and the fourth embodiments shown in FIGS. 8 and 10.

In such thin film laser emitting devices, the Bragg reflectors having thereon recesses and gratings are obtained by molding the resin and, therefore, the corrugated diffraction gratings can be easily and precisely formed in the Bragg reflectors. Further, the thin film laser layers and the electrodes can be readily formed, e.g., by the vacuum-evaporating method. As a result, thin film laser emitting devices can be easily fabricated by a simplified process.

Although the invention has been shown and described with respect to the preferred embodiments, it will be understood by those skilled in the art that various changes and modifications may be made without departing from the spirit and scope of the invention as defined in the following claims.

What is claimed is:

1. A thin film laser emitting device, comprising:
   a Bragg reflector including a recess and one or more diffraction gratings provided around the recess;
   a thin film laser layer formed in the recess, for generating lights, the lights being reflected by the diffraction gratings;
   a pair of electrodes provided in the recess to have the thin film laser layer therebetween; and
   a laser emitting means, provided at a portion of the gratings, for emanating the reflected lights.

2. The thin film laser emitting device of claim 1, wherein the Bragg reflector is made of a resin.

3. The thin film laser emitting device of claim 1, wherein the laser layer is made of an organic electroluminescent material.

4. The thin film laser emitting device of claim 1, wherein the laser emitting means is a slit-shaped opening.

5. The thin film laser emitting device of claim 1, wherein the gratings are formed by a plurality of corrugations and the number of corrugations at the portion of the gratings where the laser emitting means is provided is smaller than that at the remaining portion of the gratings.

6. The thin film laser emitting device of claim 1, wherein each of the electrodes serves as a reflecting layer.

7. A method for manufacturing a thin film laser emitting device, comprising the steps of:
   preparing a Bragg reflector including a recess and one or more diffraction gratings provided around the recess;
   providing a first electrode;
   depositing a thin film laser layer on the first electrode; and
   providing a second electrode on the thin film laser layer, wherein the first and the second electrode and the thin film laser lever are disposed in the recess.

8. A method of manufacturing the device of claim 1, comprising the steps of:
   preparing the Bragg reflector including the recess and one or more diffraction gratings provided around the recess:
   providing the first electrode;
   depositing the thin film laser layer on the first electrode; and
   providing the second electrode on the thin film laser layer, wherein the first and the second electrode and the thin film laser layer are disposed in the recess.

9. The method of claim 7 for manufacturing a thin film laser emitting device, wherein the step of preparing the Bragg reflector is carried out by using a molding technique, each of the steps of providing the first and the second electrode includes the step of evaporating a metallic layer and the depositing step includes the step of evaporating an organic electoluminescent material.

10. A laser emitting device fabricated by using the method of claim 7, comprising:
   the Bragg reflector including the recess and one or more diffraction gratings provided around the recess;
   the thin film laser layer formed in the recess, for generating lights, the lights being reflected by the diffraction gratings;
   the first and the second electrode provided in the recess to have the thin film laser layer therebetween; and
   a laser emitting means, provided at a portion of the gratings, for emanating the reflected lights.

11. A laser emitting device, comprising:
   a base member, made of a single material, including on top thereof a recessed central region and one or more diffraction gratings provided around the central region;
   a laser generating member provided on the central region, wherein the laser generating member includes a laser layer for generating lights, the lights being reflected by the diffraction gratings, arid a pair of electrodes provided in the central region to have the laser layer therebetween; and
   a laser emitting means, provided at a portion of the gratings, for emanating the reflected lights.

12. The laser emitting device of claim 11, wherein the base member is a molded single body.

13. The laser emitting device of claim 11, wherein the laser layer is made of an organic electroluminescent material.

14. The laser emitting device of claim 11, wherein the laser emitting means is a slit-shaped opening provided in one of the diffraction gratings.

15. The laser emitting device of claim 11, wherein each of the gratings are formed by a plurality of corrugations and the number of corrugations at the portion of the gratings where the laser emitting means is provided is smaller than that at the remaining portion of the gratings.

16. The laser emitting device of claim 11, wherein the recessed central region is substantially flat arid a height of the laser generating member is not greater than the height difference between the recessed central region and tile diffraction gratings.

17. The laser emitting device of claim 11, wherein the recessed central region has a substantially rectangular shape and the gratings reside on two opposite sides of the recessed central region.

18. The laser emitting device of claim 11, wherein the recessed central region has a substantially circular shape or polygonal shape having more than four sides and one continuous grating is provided around the recessed central region.

19. The laser emitting device of claim 11, wherein the base member is made of a resin and the laser layer are made of an organic electroluminescent material.

20. The laser emitting device of claim 11, wherein the laser generating member is provided after the base member and the laser emitting means are completed.

* * * * *